(12) United States Patent
Kitagawa

(10) Patent No.: US 9,024,382 B2
(45) Date of Patent: May 5, 2015

(54) SEMICONDUCTOR DEVICE

(75) Inventor: Mitsuhiko Kitagawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1060 days.

(21) Appl. No.: 13/034,443

(22) Filed: Feb. 24, 2011

(65) Prior Publication Data
US 2011/0210391 A1 Sep. 1, 2011

(30) Foreign Application Priority Data

Feb. 26, 2010 (JP) ................................ 2010-042235

(51) Int. Cl.
| | | |
|---|---|---|
| *H01L 29/78* | (2006.01) | |
| *H01L 29/423* | (2006.01) | |
| *H01L 29/739* | (2006.01) | |
| H01L 29/06 | (2006.01) | |
| H01L 29/08 | (2006.01) | |
| H01L 29/10 | (2006.01) | |
| H01L 29/417 | (2006.01) | |

(52) U.S. Cl.
CPC ......... *H01L 29/7813* (2013.01); *H01L 29/0634* (2013.01); *H01L 29/0696* (2013.01); *H01L 29/0878* (2013.01); *H01L 29/1095* (2013.01); *H01L 29/4175* (2013.01); *H01L 29/41766* (2013.01); *H01L 29/4236* (2013.01); *H01L 29/7397* (2013.01); *H01L 29/7825* (2013.01)

(58) Field of Classification Search
USPC ....................................................... 257/342
See application file for complete search history.

(56) References Cited

U.S. PATENT DOCUMENTS

| | | | |
|---|---|---|---|
| 5,554,862 A * | 9/1996 | Omura et al. ................. | 257/137 |
| 8,354,711 B2 * | 1/2013 | Zeng et al. ................... | 257/330 |
| 2003/0052329 A1 | 3/2003 | Kobayashi et al. | |
| 2008/0073707 A1 | 3/2008 | Darwish | |

FOREIGN PATENT DOCUMENTS

| | | |
|---|---|---|
| JP | 2001168333 A | 6/2001 |
| JP | 2002-016252 A | 1/2002 |
| JP | 2009-135360 | 6/2009 |
| JP | 2011165928 A | 8/2011 |

(Continued)

OTHER PUBLICATIONS

Chinese Office Action dated Jul. 2, 2013, filed in Chinese counterpart Application No. 201110046610.1, 7 pages (with translation).
Japanese Office Action dated Nov. 26, 2013, filed in Japanese counterpart Application No. 2010-042235, 6 pages (with translation).
Chinese Office Action dated Dec. 17, 2012, filed in Chinese counterpart Application No. 201110046610.1, 19 pages (in English and Chinese).

(Continued)

*Primary Examiner* — Jerome Jackson, Jr.
(74) *Attorney, Agent, or Firm* — Patterson & Sheridan, LLP

(57) ABSTRACT

According to one embodiment, the semiconductor device includes a drift region, a first semiconductor region, a second semiconductor region, a main electrode, first gate electrodes and a second gate electrode. The first gate electrodes and the second gate electrode between a pair of first gate electrodes are provided in the drift region. The first semiconductor region is provided between the first gate electrodes and the second gate electrode. The first semiconductor region has a first side surface opposite to the one of the adjacent ones and a second side surface partially opposite to the second gate electrode. The second semiconductor region is selectively provided on the first semiconductor region. The main electrode has a portion directly adjacent to part of the second side surface and the second semiconductor region.

17 Claims, 14 Drawing Sheets

(56) References Cited

FOREIGN PATENT DOCUMENTS

| WO | 2005065385 | A2 | 7/2005 |
|----|------------|----|--------|
| WO | 2005065385 | A3 | 7/2005 |

OTHER PUBLICATIONS

Japanese Office Action dated Oct. 10, 2014, filed in Japanese counterpart Application No. 2010-042235, 6 pages (with translation).

* cited by examiner

US 9,024,382 B2

SEMICONDUCTOR DEVICE

CROSS-REFERENCE TO RELATED APPLICATIONS

This application is based upon and claims the benefit of priority from Japanese Patent Application No. 2010-042235, filed on Feb. 26, 2010; the entire, contents of which are incorporated herein by reference.

FIELD

An embodiment of this invention generally relates to a semiconductor device.

BACKGROUND

Semiconductor devices for power control, such as IGBT (Insulated Gate Bipolar Transistor), IEGT (Injection Enhanced Gate Transistor), Super junction MOSFET, Thyristor and GTO (Gate Turn Off) Thyristor and the like, are required to have small ON resistance during a switching operation in order to reduce power loss. Thus, a trench gate structure is employed in the power semiconductor devices, where a gate electrode is embedded in a trench.

In the trench gate structure, since a current channel is formed in the longitudinal direction perpendicular to a substrate, a gate interval in the lateral direction can be narrowed. As a result, it becomes possible to miniaturize a device structure and to widen a substantial channel width, whereby the ON resistance can be made smaller than that of a planar gate structure in which the current channel is formed in the lateral direction. Furthermore, it is advantageous to improve performances by raising a switching speed, since the device size can be made smaller in the trench gate structure than that in the planar gate structure.

On the other hand, if miniaturization of the device structure is proceeded with by narrowing the gate interval, avalanche breakdown is prone to occur, and a short-circuit current may increase. In order to cope with them, the ON resistance can be reduced, while a drain-source breakdown voltage is maintained, by forming a trench contact, which is electrically in contact with a base layer, between the gate electrodes. However, it requires a space where the trench contact is provided, and the miniaturization is inevitably limited.

DETAILED DESCRIPTION

Figure 1:
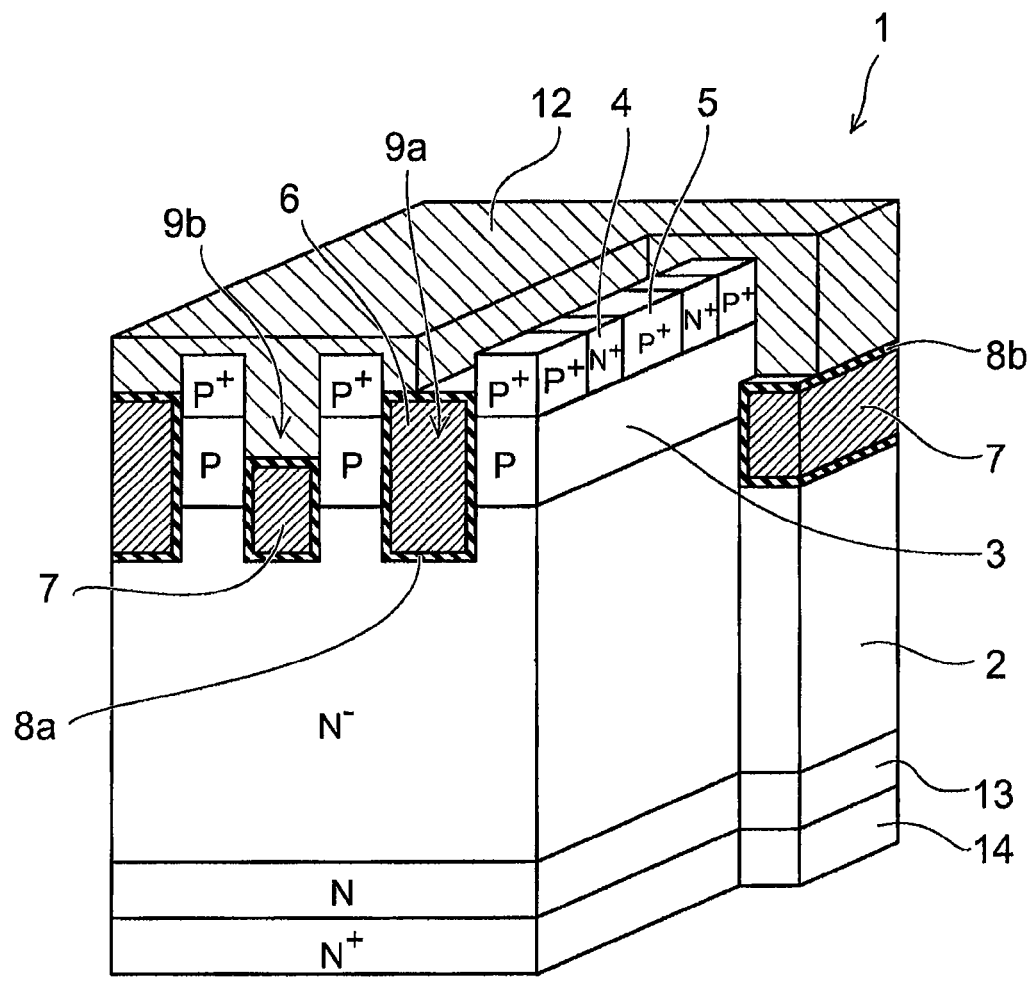
FIG. 1 is a partial cross-sectional view schematically illustrating a structure of a semiconductor device according to a first embodiment.

In general, according to one embodiment, the semiconductor device includes a drift region including a semiconductor of a first conductivity type; a first semiconductor region of a second conductivity type provided adjacently to the drift region; a main electrode, a plurality of first gate electrodes and a second gate electrode. The main electrode is provided adjacently to the first semiconductor region and electrically connected to the first semiconductor region, the first semiconductor region being disposed between the drift region and the main electrode. The first gate electrodes are provided along a boundary between the drift region and the first semiconductor region. The first gate electrode has a trench structure and faces the drift region and the first semiconductor region via a first gate insulating film. The second gate electrode of the trench structure is provided along the boundary between the drift region and the first semiconductor region. The second gate electrode is disposed between the two first gate electrodes and faces the drift region and the first semiconductor region via a second gate insulating film. A first portion facing the first semiconductor region in the second gate electrode is shorter than a second portion facing the first semiconductor region in the first gate electrode in a direction from the boundary to the main electrode. The main electrode is extended to a position close to the second gate electrode in the trench provided in the direction from the main electrode to the second gate electrode between the two first gate electrodes. The main electrode is in contact with the first semiconductor region exposed to an inner wall surface of the trench between an end of the first gate electrode on the main electrode side and an end of the second gate electrode on the main electrode side.

Exemplary embodiments of the invention will now be described with reference to the drawings. In the following embodiments, similar components in the drawings are marked with like reference numerals, and detailed description will be omitted as appropriate, while different components will be described as appropriate. In the description hereinbelow, a first conductivity type refers to a P-type and a second conductivity type to an N-type, respectively.

First Embodiment

FIG. 1 is a partial sectional view schematically illustrating a structure of a semiconductor device according to a first embodiment. Here, a MOSFET 1 is described as an example of the semiconductor device, but the embodiment can be also applied to other semiconductor devices including an IGBT, an IEGT and the like.

As shown in FIG. 1, the semiconductor device according to this embodiment includes an N-type drift region 2 and a P-type base region 3, which is a first semiconductor region provided adjacently to the drift region 2. Also, a source electrode 12, which is a main electrode opposite to the drift region 2 with the base region 3 therebetween, is provided and electrically connected to the base region 3. On the other hand, at the boundary between the drift region 2 and the base region 3, a plurality of gate electrodes 6, which are first gate electrodes of the trench structure, are provided along the boundary. The gate electrode 6 faces the drift region 2 and the base region 3 via a gate insulating film 8a, which is a first gate insulating film.

Moreover, between the two gate electrodes 6, a gate electrode 7, which is a second gate electrode of the trench structure, is provided along the boundary between the drift region 2 and the base region 3. The gate electrode 7 also faces the drift region 2 and the base region 3 via a gate insulating film 8b, which is a second gate insulating film. The gate electrode 7 includes a first portion facing the base region 3 shorter than a second portion facing the base region 3 in the gate electrode 6 in the direction from the boundary between the drift region 2 and the base region 3 to the source electrode 12.

On the other hand, the source electrode 12 is extended to a position close to the gate electrode 7 in a trench 9b. The trench 9b is provided in the direction from the source electrode 12 to the gate electrode 7 between the two gate electrodes 6. The source electrode 12 is in contact with the base region 3 via an exposed portion in an inner wall surface of the trench 9b. As illustrated in FIG. 1, the portion of the base region 3 is exposed in the inner wall surface between an end level of the gate electrode 6 on the source electrode 12 side and an end level of the gate electrode 7 on the source electrode 12 side.

Moreover, as shown in a portion excluding the source electrode 12 in FIG. 1, in the MOSFET 1 according to this embodiment, an N-type source region 4, which is a second semiconductor region, and a P-type contact region 5 (sixth semiconductor region) are selectively provided between the base region 3 and the source electrode 12. The gate electrode 6 is provided in a trench 9a facing the drift region 2, the base region 3, and the source region 4 via the gate insulating film 8a; and controls a channel formed in an interface between the base region 3 and the gate insulating film 8a. On the other hand, the source electrode 12 is extended toward the gate electrode 7 in the trench 9b, and is in contact with the base region 3 exposed in the inner wall surface.

Figure 16:
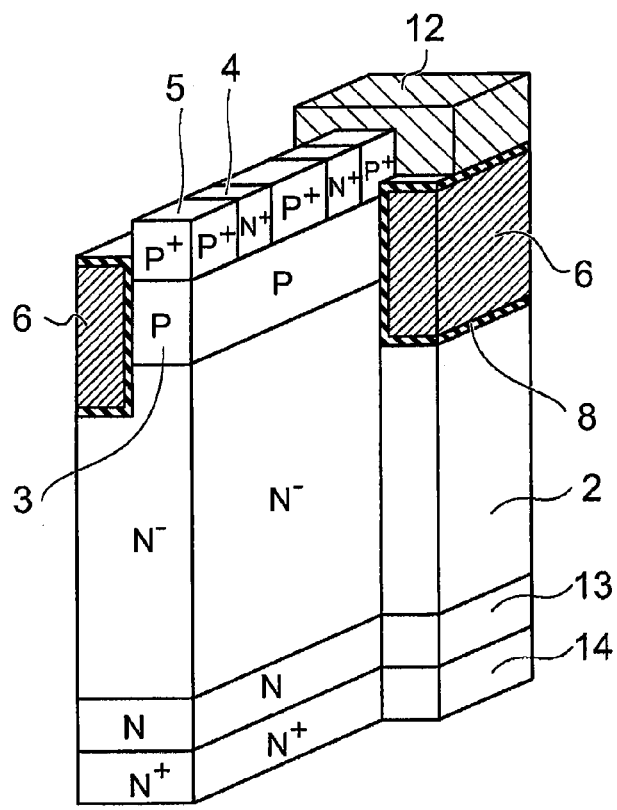
FIG. 16 is a partial cross-sectional view schematically illustrating a structure of a semiconductor device according to a comparative example.

For example, in a MOSFET shown in FIG. 16, all the gate electrodes 6 are provided in the trench, facing the drift region 2, the base region 3, and the source region 4 via the gate insulating film 8. Therefore, a hole injected from the drift region 2 into the base region 3 is, for example, discharged to the source electrode 12 via the contact region 5 selectively provided on the base region 3. On the other hand, the MOSFET 1 according to this embodiment is so configured that the hole is directly discharged to the source electrode 12 from the base region 3 exposed in the inner wall surface of the trench 9b.

On the side opposite to the surface of the drift region 2 in contact with the base region 3, an N-type semiconductor region 13 and an N-type drain region 14 are provided with higher N-type impurity concentration than the drift region 2. Moreover, a drain electrode (not shown) is provided and electrically connected to the drain region 14. Here, if the drain region 14 is a semiconductor region (seventh semiconductor region) doped with P-type impurity, for example, FIG. 1 is a structure of an IGBT or an IEGT.

Figure 2C:
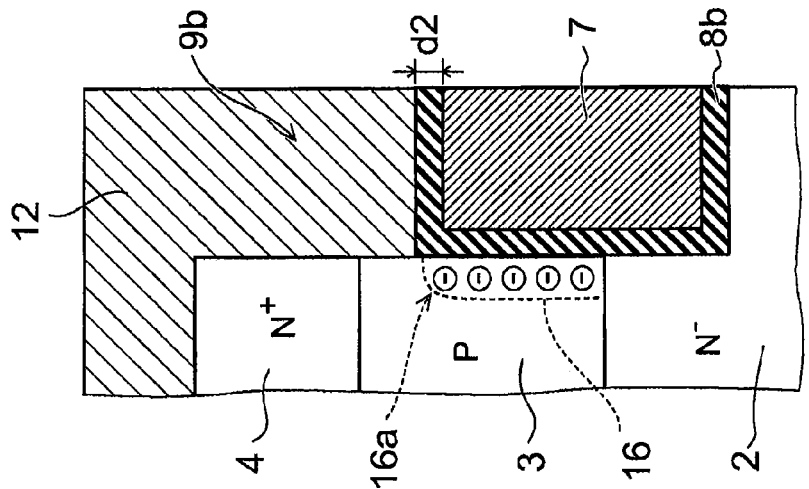
FIGS. 2A to 2C are schematic diagrams for explaining an operation of the semiconductor device according to the first embodiment.
Figure 2B:
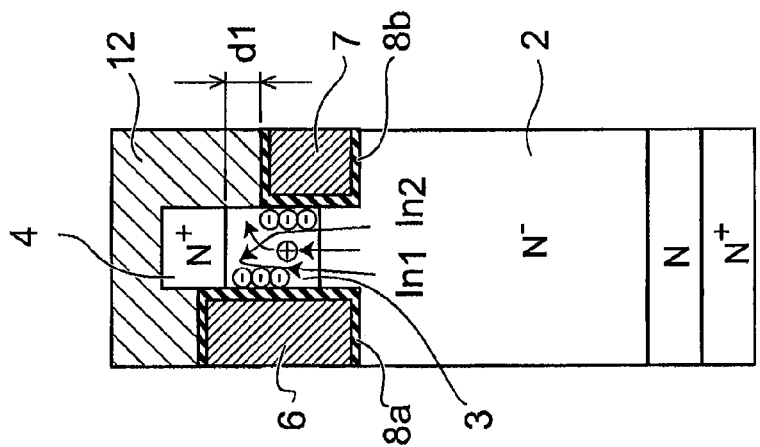
Figure 2A:
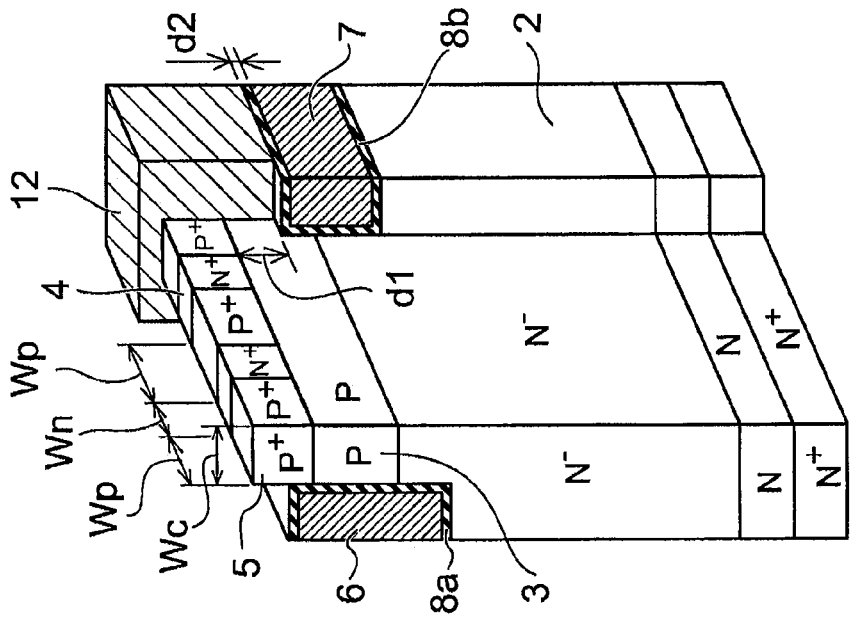

FIGS. 2A, 2B and 2C are schematic diagrams for explaining an operation of the MOSFET 1 according to the first embodiment. FIG. 2A schematically illustrates a part of a cross-sectional structure of the MOSFET 1. FIGS. 2B and 2C are cross-sectional views illustrating an operation of the MOSFET.

In order to reduce the ON resistance of the MOSFET 1, the number of the gate electrodes 6 contained in the MOSFET 1 can be increased by narrowing a width $W_C$ of the base region 3 between the gate electrode 6 and the gate electrode 7 shown in FIG. 2A. As a result, the number of current channels formed in the interface between the gate insulating film 8 and the base region 3 can be increased, whereby the ON resistance can be lowered.

On the other hand, if the width $W_C$ of the base region 3 is narrowed, an amount of the P-type impurities contained in the base region 3 is reduced. If the miniaturization is proceeded with to 200 nm or less, for example, an amount of holes injected into the base region 3 from the drift region 2 becomes unignorable with respect to the amount of the P-type impurities contained in the base region 3. That is, the current channel formed in the interface between the base region 3 and the gate insulating film 8 may be affected and become unstable. Owing to the hole injection, for example, the P-type carrier concentration of the base region 3 is substantially changed and a threshold voltage $V_{TH}$ is fluctuated. Thus, a current flowing between the source and the drain may become uncontrollable by applying a gate voltage to the gate electrode.

Therefore, if the width $W_C$ of the base region 3 is formed narrow, it is preferable to smoothly discharge the hole to the source electrode 12 via the P-type contact region 5, whereby the holes are not accumulated in the base region 3. In a structure as the MOSFET shown in FIG. 16, in which the gate electrode 6 is adjacent to the source region 4 and the contact region 5 and the gate electrodes are provided symmetrically with the base region 3 therebetween, the hole injected into the base region 3 moves to the source electrode 12 via the contact region 5. Thus, a width $W_P$ of the contact region 5 is preferable to be wider, but then, a width $W_N$ of the source region 4 is relatively narrowed, whereby the ON resistance is increased.

Thus, in the MOSFET according to this embodiment, the gate electrode 7 is provided so as to face the drift region 2 and a part of the base region 3 via the gate insulating film 8b, whereby the portion of the gate electrode 7 facing the base region 3 becomes shorter than the portion of the gate electrode 6 facing the base region 3. As a result, the structure in which the source electrode 12 is in contact with a part of the base region 3 exposed between the gate electrode 7 and the source region 4 is obtained.

As shown in FIG. 2B, the hole injected into the base region 3 from the drift region 2 is discharged to the source electrode 12 from the portion where the base region 3 between the gate electrode 7 and the source region 4 is in contract with the source electrode 12. Therefore, the discharge of the hole is made smoother by widening the portion where the source electrode 12 is in contact with the base region 3, i.e. expanding a width d1 in the direction from the source region 4 to the drift region 2. For example, it may be provided with d1>0.05 µm.

As a result, the holes may not be accumulated in the base region 3, and fluctuation of $V_{TH}$ can be suppressed. Furthermore, since discharge resistance of the hole from the drift region 2 to the source electrode 12 via the base region 3 also becomes smaller, the avalanche breakdown may be suppressed by smoothly discharging the hole generated in the drift region 2.

On the other hand, in the MOSFET according to this embodiment, since the gate electrode 7 is separated from the source region 4, there is no current path directly flowing to the drift region 2 from the source region 4 via a channel formed between the gate electrode 7 and the base region 3. However, if the width $W_C$ of the base region 3 is narrowed, as shown in FIG. 2B, a current In2 flowing via the channel on the gate electrode 7 side merges with a current In1 flowing through a current channel on the gate electrode 6 side. Therefore, the current In2 may also contribute to the total current, whereby channel resistance can be lowered and the low ON resistance can be maintained.

If the advantages of the MOSFET according to this embodiment are viewed from another point, it can be considered as follows. The P-type region which includes both the contact region 5 and the base region 3 has the wider area in contact with the source electrode 12 in the trench 9b, where the gate electrode 7 is embedded, than in the trench 9a where the gate electrode 6 is embedded. In other words, providing the smaller gate electrode in the trench relatively increases the area of the source electrode 12 in contact with the P-type region, whereby the hole can be efficiently discharged from the base region 3 to the source electrode 12.

FIG. 2C is a schematic diagram illustrating an N-type channel 16 formed between the gate electrode 7 and the base region 3. If a positive gate voltage is applied to the gate electrode 7, an inversion layer, where electrons are attracted to the interface between the gate insulating film 8 and the base region 3, is formed as the channel 16. Furthermore, the inversion layer is formed with a channel end 16a extending in the direction of the source electrode 12 at the end of the gate electrode 7 on the source region side. If the channel end 16a is connected to the source electrode 12, a current path is formed from the source electrode 12 to the drift layer 2, and an excess current may flow therethrough. Thus, it is preferable that a distance d2 between the end of the gate electrode 7 on the inner wall surface side of the trench 9b and the source electrode 12 is set somewhat wider. It may be d2>0.05 μm, for example.

For example, the gate insulating film 8 may be formed between the gate electrode 7 and the source electrode 12, or a gap may be provided between the gate electrode 7 and the source electrode 12, whereby the distance of d2>0.05 μm is obtained.

Figure 3:
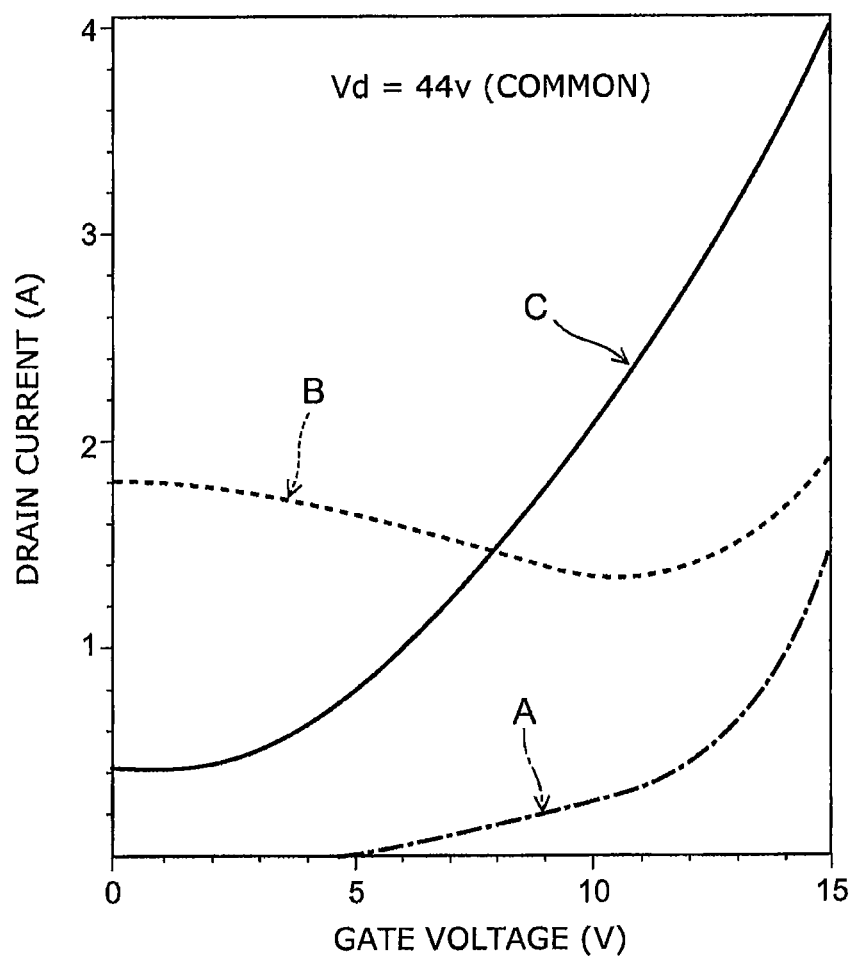
FIG. 3 is a graph illustrating characteristics of the semiconductor device according to the first embodiment.

FIG. 3 is a graph illustrating characteristics of the MOSFET 1 according to the first embodiment. A drain current flowing between the source-drain is shown on the vertical axis, while a gate voltage is shown on the horizontal axis. A graph A shown in the figure illustrates the characteristics of the MOSFET 1 according to this embodiment. A graph B illustrates a drain current in the case where d1 is smaller than 0.05 μm. As mentioned before, d1 is the width of the portion between the gate electrode 7 and the source region 4, where the source electrode 12 is in contact with the base region 3. On the other hand, a graph C illustrates the characteristics of the MOSFET shown in FIG. 16.

As shown in FIG. 3, even if 44V of a bias voltage Vd between the source-drain is applied, when the gate voltage is 0V, a drain current does not flow in the MOSFET 1 according to this embodiment shown in the graph A. On the other hand, the drain current flows in the MOSFET shown in the graphs B and C. That is, in the MOSFET shown in the graph B with d1<0.05 μm and the MOSFET shown in the graph C, gate control might become impossible in some cases. Therefore, it is found that the MOSFET 1 according to this embodiment is more advantageous, where d1>0.05 μm and the hole is discharged from the base region 3 directly to the source electrode 12.

Figure 4:
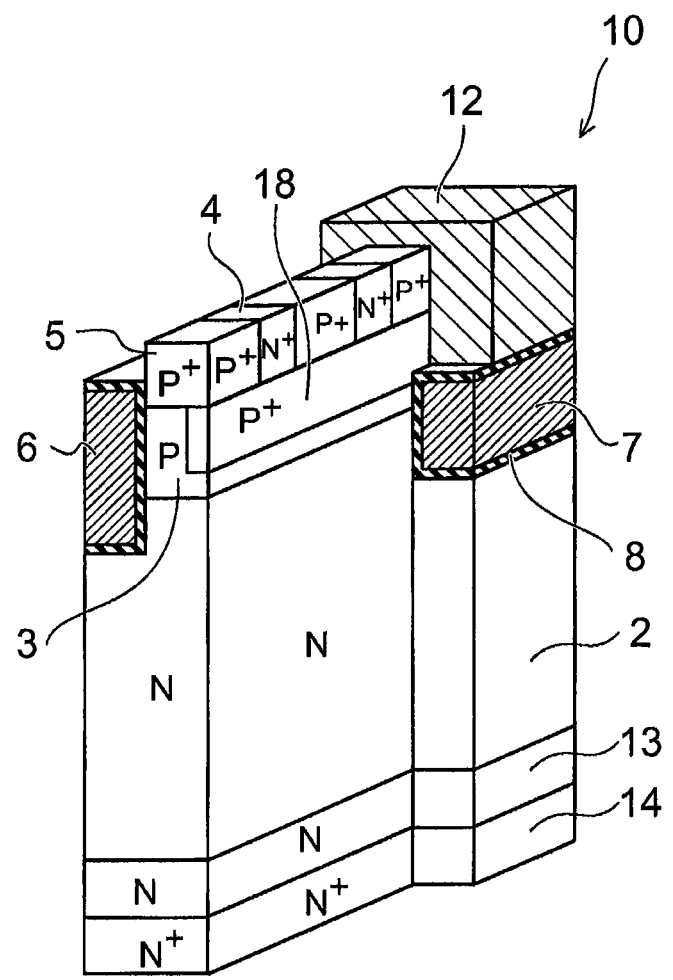
FIG. 4 is a partial cross-sectional view schematically illustrating a structure of a semiconductor device according to a variation of the first embodiment.

FIG. 4 is a partial sectional view schematically illustrating a structure of a MOSFET 10 according to a variation of the first embodiment. This is different from the MOSFET 1 shown in FIG. 1 in a point that a $P^+$-type region 18, which is a third semiconductor region having a higher P-type impurity concentration than the base region 3, is provided in a portion where the base region 3 exposed between the source region 4 and the gate electrode 7. Thus, the $P^+$-type region 18 is in contact with the source electrode 12. By providing this $P^+$-type region 18, an excess drain current flowing between the source-drain can be suppressed.

Figure 5:
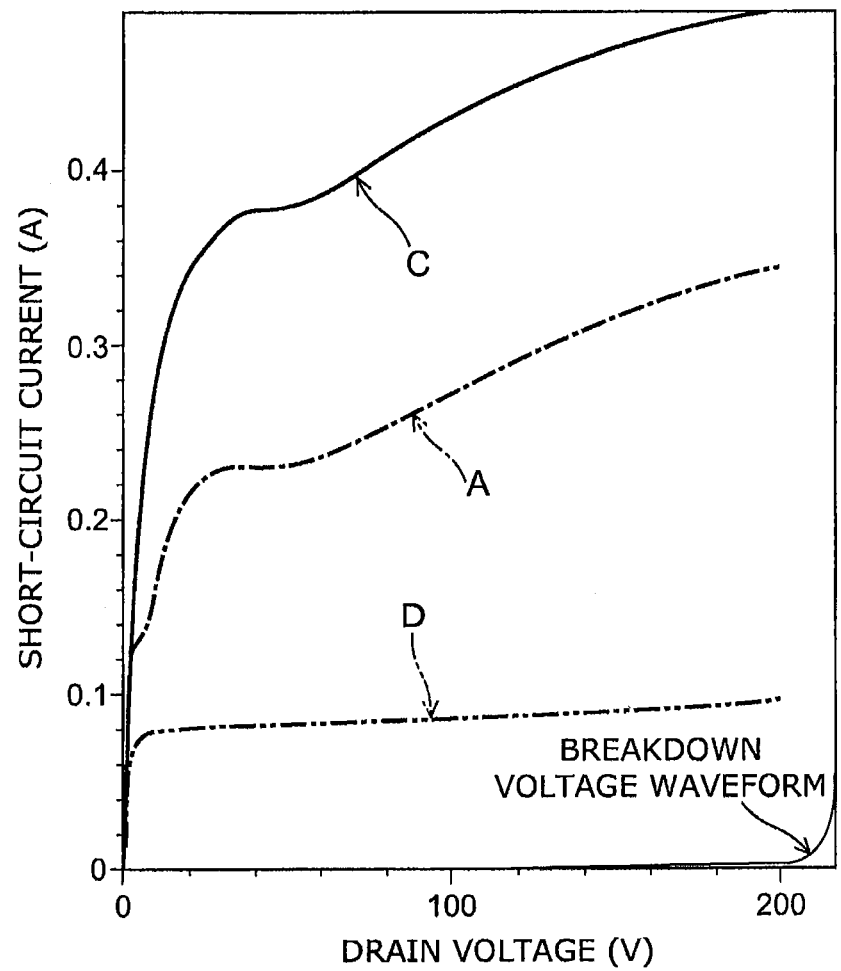
FIGS. 5 and 6 are graphs illustrating characteristics of the semiconductor devices according to the first embodiment.
Figure 6:
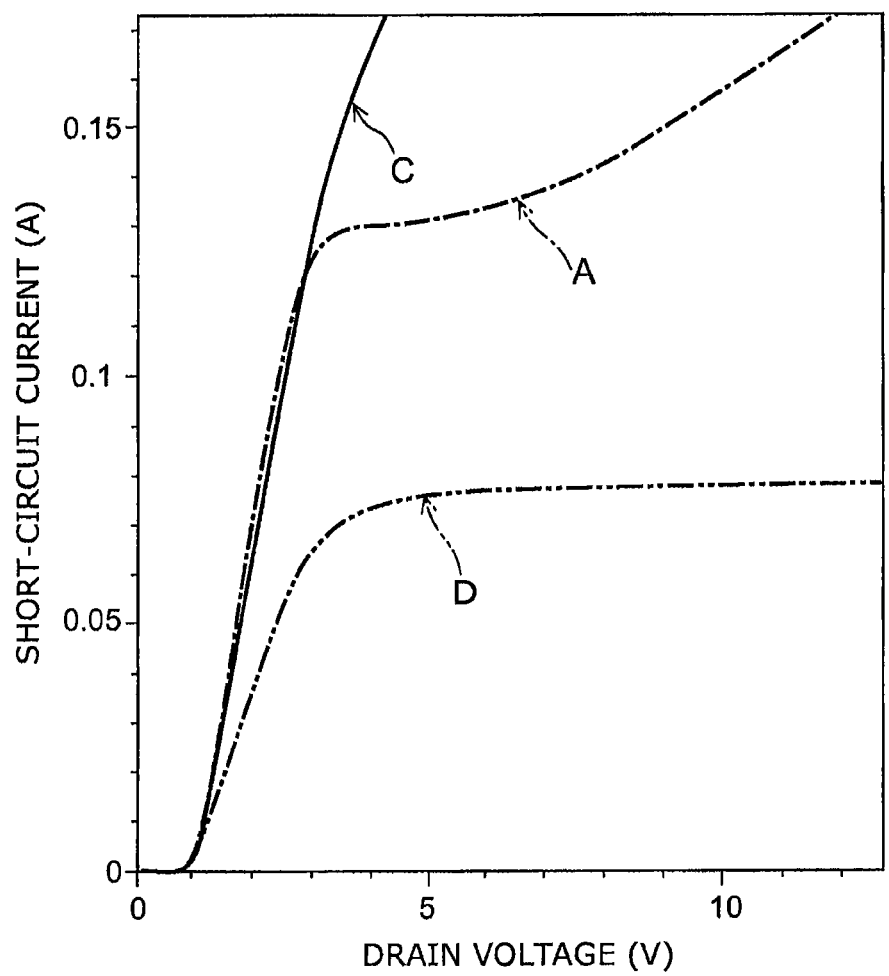

FIGS. 5 and 6 are graphs illustrating characteristics of the MOSFET 1 and the MOSFET 10 according to the first embodiment. A short-circuit current is shown on the vertical axis, while a drain voltage is shown on the horizontal axis. The short-circuit current flows in the MOSFETs when a load connected to the source and drain electrodes is short-circuited. The graph A in the figure illustrates the short-circuit current of the MOSFET 1, and a graph D illustrates the short-circuit current of the MOSFET 10. Also, the graph C illustrates the short-circuit current of the MOSFET shown in FIG. 16.

In the MOSFET 1 shown in the graph A, since the channel 16 formed on the gate electrode 7 side is not directly connected to the source region 4, the short-circuit current merges with a current flowing through a current channel on the gate electrode 6 side and flows to the source region 2 in a concentrated way. Therefore, as compared with the MOSFET corresponding to the graph C, where the current also flows through the channel on the gate electrode 7 side, resistance is increased against the excessively flowing short-circuit current. As a result, the short-circuit current is limited to approximately ½ of the MOSFET shown in the graph C. As a result, it becomes possible to shut off the short-circuit current by setting the gate voltage applied to the gate electrodes 6 and 7 at 0V.

On the other hand, in the MOSFET 10 shown in the graph D, the short-circuit current is further decreased to approximately ⅕ of the MOSFET shown in the graph C and approximately ⅓ of the MOSFET 1 shown in the graph A. This may be the case where the $P^+$-type region 18 provided on the base region 3 narrows the current path and limits the short-circuit current. As a result, even if a load connected to the source and drain electrodes is short-circuited, the short-circuit current may be easily controlled by the gate voltage.

FIG. 6 illustrates a low-voltage portion of the graph in FIG. 5 illustrating a relationship between the short-circuit current and the drain voltage in an enlarged manner. As shown in this figure, the graph C illustrating the characteristics of the prior-art MOSFET substantially matches the graph A illustrating the characteristics of the MOSFET 1 up to approximately 0.12 A of the short-circuit current. That is, it indicates that the channel resistance is not raised in the MOSFET 1 in which the channel on the gate electrode 7 side is provided apart from the source region 4 but a low ON resistance can be maintained for the drain current up to approximately 0.12 A.

On the other hand, in the MOSFET 10 shown in the graph D, since the $P^+$-type region 18 is provided on the base region 3, it is found that the channel resistance is slightly higher, but the short-circuit current is effectively suppressed.

Figure 7A:
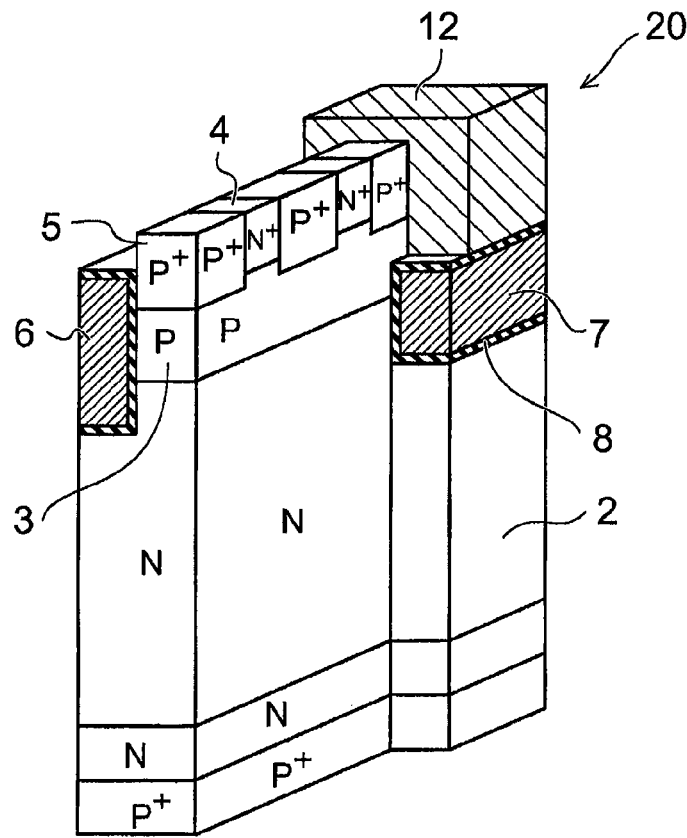
FIGS. 7A to 8B are partial cross-sectional views schematically illustrating structures of semiconductor devices according to another variations of the first embodiment.
Figure 7B:
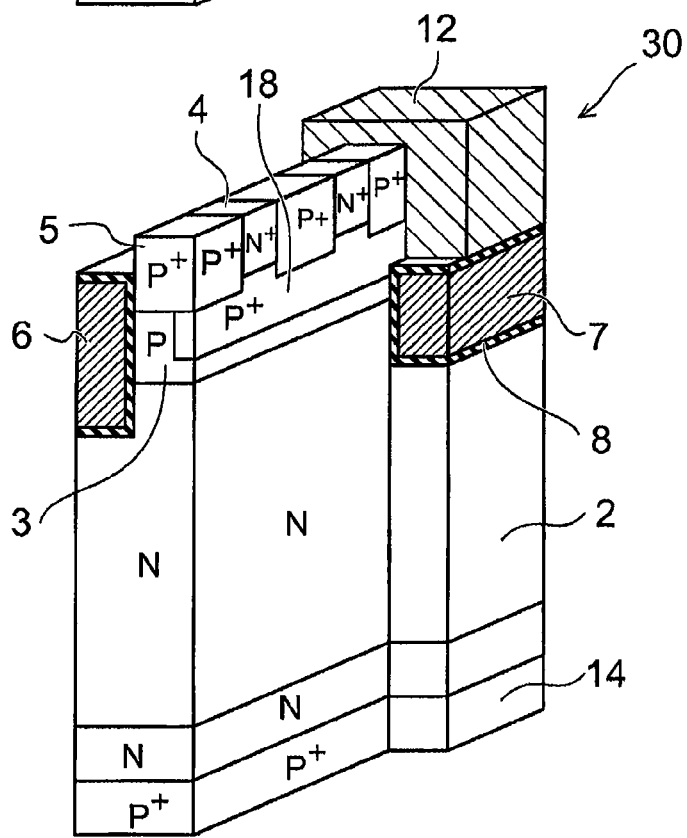

FIGS. 7A and 7B are partial sectional views schematically illustrating structures of MOSFETs 20 and 30 according to variations of the first embodiment.

In the MOSFET 20 shown in FIG. 7A, the contact region 5 is formed deeper in the direction of the base region 3 than the source region 4. As a result, discharge resistance of a path through which the hole injected into the base region 3 from the drift layer 2 is discharged via the P-type contact region 5 can be lowered. As a result, concentration fluctuation of a P-type carrier in the base region 3 can be suppressed, whereby controllability of the drain current by the gate voltage can be improved, and the avalanche capability between the base region 3 and the drift layer 2 can be improved.

The MOSFET 30 shown in FIG. 7B has a structure in which the $P^+$-type region 18 is further provided in the base region 3 of the MOSFET 20 shown in FIG. 7A. As a result, the short-circuit current can be suppressed, whereby short-circuit capability can be improved.

Figure 8A:
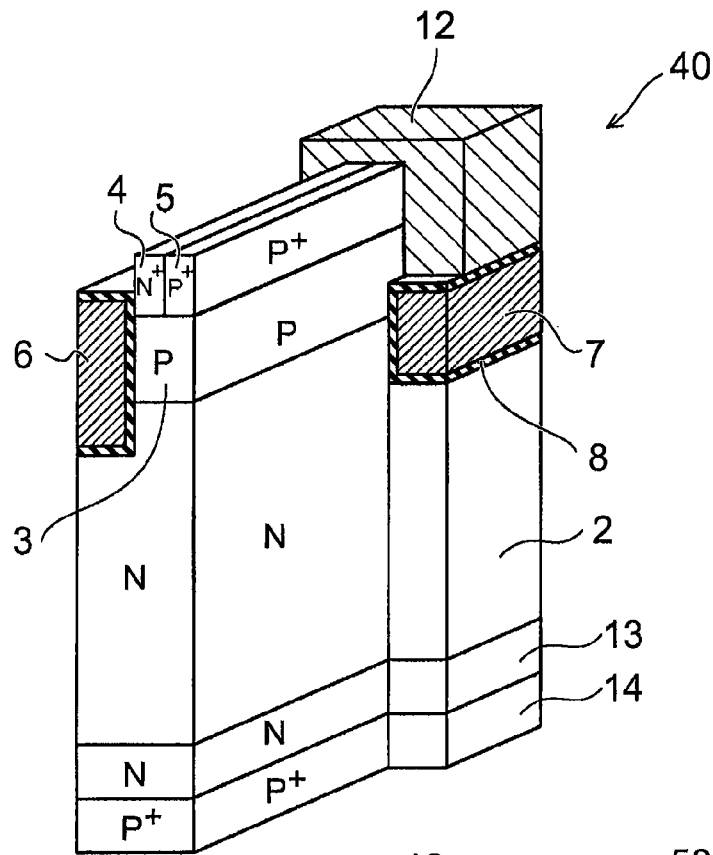
Figure 8B:
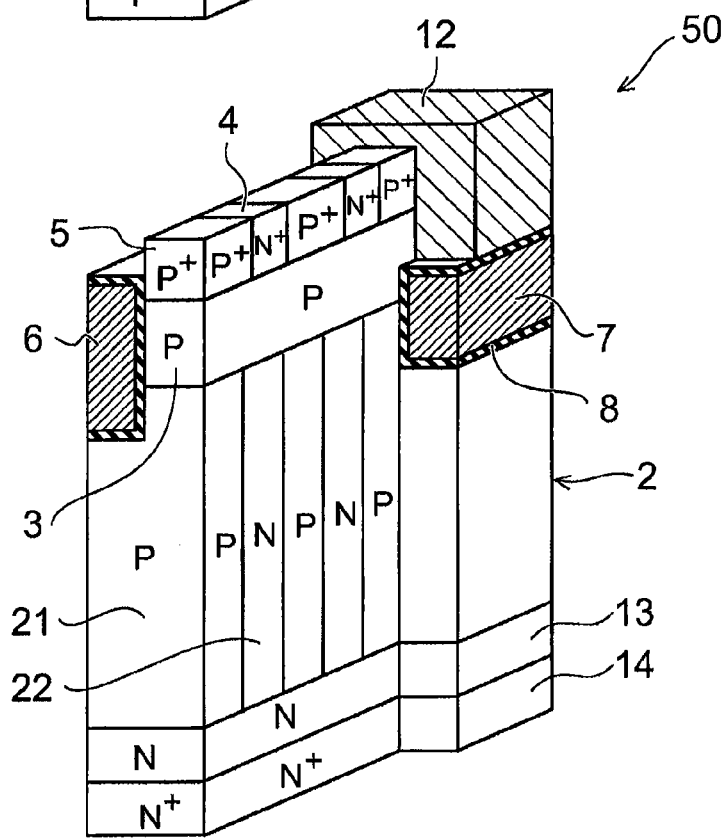

FIGS. 8A and 8B are partial sectional views schematically illustrating structures of MOSFETs 40 and 50 according to variations of the first embodiment.

In the MOSFET 40 shown in FIG. 8A, the source region 4 is provided on the surface of the base region 3 along the gate electrode 6. As a result, the source region 4 can be connected to all the current channels formed between the gate electrode 6 and the base region 3, whereby the channel resistance is lowered and the ON resistance can be reduced.

On the other hand, the contact region 5 is formed on the side of the gate electrode 7 in parallel with the source region 4. As a result, a path of the hole discharged from the base region 3 is only the source electrode in contact on the side of the gate electrode 7, but the discharge resistance of the hole can be reduced by widening the contact area.

In the MOSFET 50 shown in FIG. 8B, the drift region 2 is provided with a super junction structure in which a P-type pillar 21, which is a fifth semiconductor region, and an N-type pillar 22, which is a fourth semiconductor region, are alternately arranged along the boundary with the base region 3. By using the super junction structure, the ON resistance can be reduced by increasing concentration of the N-type pillar 22.

Second Embodiment

Figure 9A:
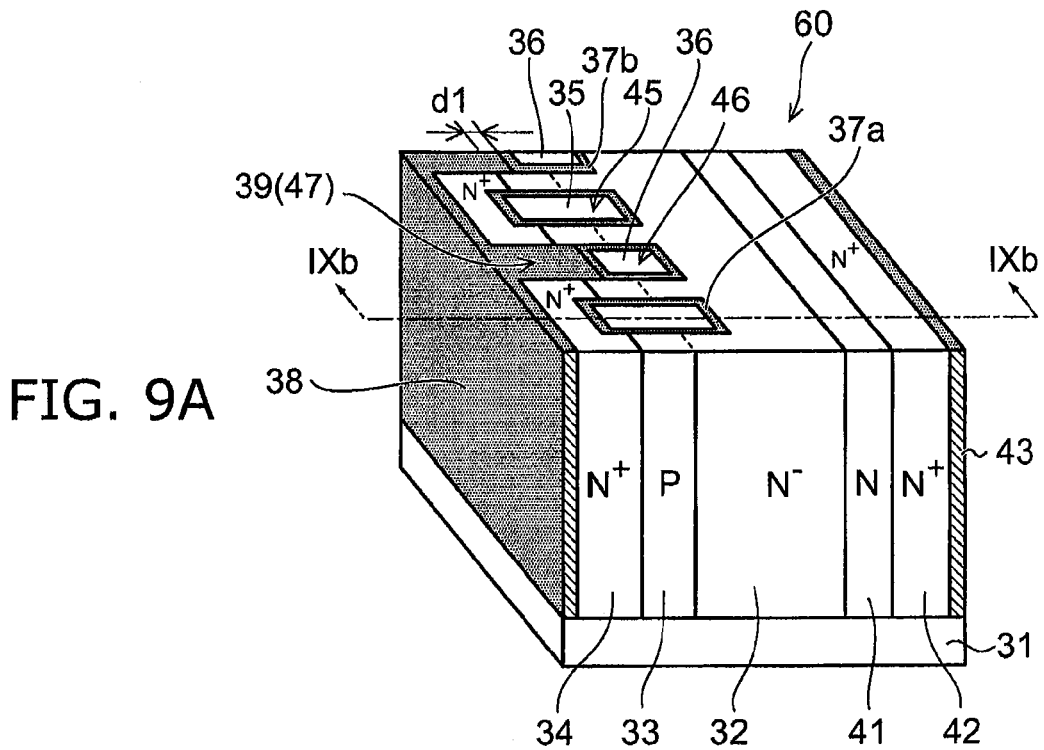
FIGS. 9A and 9B are partial cross-sectional views schematically illustrating a structure of a semiconductor device according to a second embodiment.
Figure 9B:
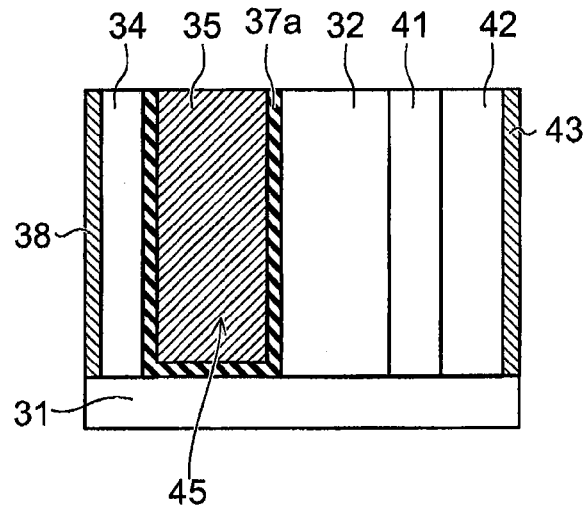

FIGS. 9A and 9B are partial sectional views schematically illustrating a structure of a semiconductor device according to a second embodiment. A MOSFET 60 according to this embodiment has a lateral structure provided on a main surface of an insulating layer 31. The insulating layer 31 may be an insulating film such as SiO2 or the like provided on a substrate or may be a semiconductor layer having a semi-insulating property.

As shown in FIG. 9A, the MOSFET 60 is provided with a drift region 32 including an N-type semiconductor provided on the main surface of the insulating layer 31 (or a semi-insulating layer). A P-type base region 33, which is a first semiconductor region, is provided adjacently to the drift region 32 in the lateral direction parallel with the main surface, and a N-type source region 34, which is a second semiconductor region, is provided adjacently to the base region 33 in the lateral direction. Also, a source electrode 38, which is a main electrode, is provided in contact with a side face of the source region 34 opposite to the side face in contact with the base region 33.

In the direction of the insulating layer 31 from the surface across the drift region 32, the base region 33, and the source region 34, a plurality of trenches 45 are formed along the boundary between the drift region 32 and the base region 33. In the trench 45, a gate electrode 35, which is a first gate electrode, is provided. Moreover, between the two gate electrodes 35, a trench 46 is formed in the direction of the insulating layer 31 from the surface across the drift region 32 and a part of the base region 33 along the boundary between the drift region 32 and the base region 33. In the trench 46, a gate electrode 36, which is a second gate electrode, is provided. Therefore, in the direction from the boundary between the drift region 32 and the base region 33 toward the source electrode 38, the length of the gate electrode 36 facing the base region 33 via a gate insulating film 37b is set shorter than the length of the gate electrode 35 facing the base region 33 via a gate insulating film 37a.

Moreover, a part of the source electrode 38 is provided extending into a trench 47 formed in the direction from the source electrode 38 toward the gate electrode 46 between the two gate electrodes 35. The trench 47 is formed in the direction of the insulating layer 31 from the surface across the source region 34 and a part of the base region 33. Also, the source electrode 38 is extended into the trench 47 to a position close to the gate electrode 46 over the position at the end on the source electrode 38 side of the gate electrode 35 and is electrically connected to the base region 33 exposed in the inner wall surface of the trench 47 between the gate electrode 36 and the source region 34.

On the other hand, an N-type semiconductor region 41 adjacent to the drift region 32 is provided with higher N-type impurity concentration than the drift region 32 and a drain region 42 adjacent to the N-type semiconductor region 41 are provided. Moreover, a drain electrode 43 electrically connected to the drain region 42 is provided.

FIG. 9B is a schematic diagram illustrating an IXb-IXb section shown in FIG. 9A. As shown in this figure, the trench 45 is provided in communication with the insulating layer 31. Moreover, in the inner surface of the trench 45, a gate insulating film 37a is formed, and the inside of the trench 45 is filled with the gate electrode 35 made of conductive polysilicon, for example. The gate electrode 36 provided in the trench 46 may be also formed similarly. Also, the same applies to the MOSFETs according to embodiments shown through FIG. 12.

In the MOSFET 60 according to this embodiment, an extended portion 39 of the source electrode 38 is provided from the surface of the source region 34 into the trench 47 communicating with the insulating layer 31 from the surface across a part of the surface of the base region 33. As a result, the source electrode 38 is in contact with the base region 33 exposed in the inner surface of the trench 47 between the gate electrode 36 and the source region 34 and can discharge the hole injected into the base region 33 from the drift region 32.

Also, the width d1 of a contact portion, where the extended portion 39 is in contact with the base region 33, is set at 0.05 μm or more so that the drain current flowing between the source and drain may be prevented from being uncontrollable.

If the thicknesses of the drift region 32, the base region 33, the source region 34 and the like provided on the insulating layer 31 are small, the MOSFET 60 according to this embodiment can be formed by ion implantation of N-type and P-type impurities into the semiconductor layer provided on the insulating layer 31, for example. On the other hand, if each semiconductor region is to be provided thick, it can be formed by multi processing steps combining epitaxial growth and ion implantation. The same applies to the lateral-type MOSFET, which will be described in FIG. 10. Here, the thickness means a layer thickness in a direction from the insulating layer 31 to the surface of each semiconductor region.

Furthermore, in this embodiment, supposing that the drain region 42 is a P-type semiconductor region doped with a P-type impurity, FIGS. 9A and 9B illustrate a structure of an IGBT or an IEGT. The same applies to the embodiments shown through FIG. 12.

Figure 10:
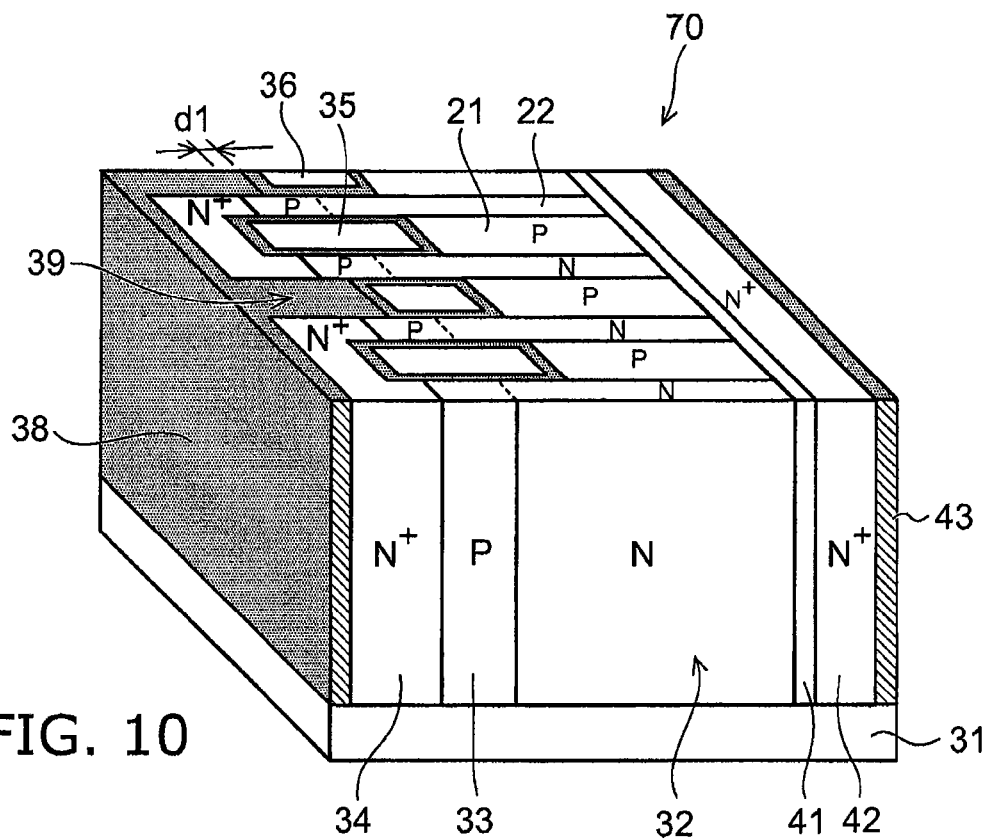
FIGS. 10 to 12 are partial cross-sectional views schematically illustrating a structure of a semiconductor device according to variations of the second embodiment.

FIG. 10 is a partial sectional view schematically illustrating a structure of a MOSFET 70 according to a variation of the second embodiment. The MOSFET 70 includes the drift region 32 provided with a super junction structure, where the P-type pillar 21, which is the fifth semiconductor region, and the N-type pillar 22, which is the fourth semiconductor region, are alternately arranged along the boundary between the drift region 32 and the base region 33.

Similarly to the MOSFET 60 shown in FIGS. 9A and 9B, in the MOSFET 70 according to this variation, the extended portion 39 of the source electrode 38 can discharge the hole of the base region 33 to the source electrode 38 via the contact portion in contact with the base region 33 between the gate electrode 36 and the source region 34. As a result, since the threshold voltage $V_{TH}$ can be made stable, the width of the base region 33 between the gate electrode 35 and the gate electrode 36 can be made small. Therefore, the channel resistance can be reduced by increasing the number of channels of the MOSFET. Moreover, by using the super junction structure, the resistance of the drift region can be reduced by increasing the carrier concentration of the N-type pillar 22 connected to the base region 33. As a result, the ON resistance of the MOSFET 70 can be reduced.

Figure 11:
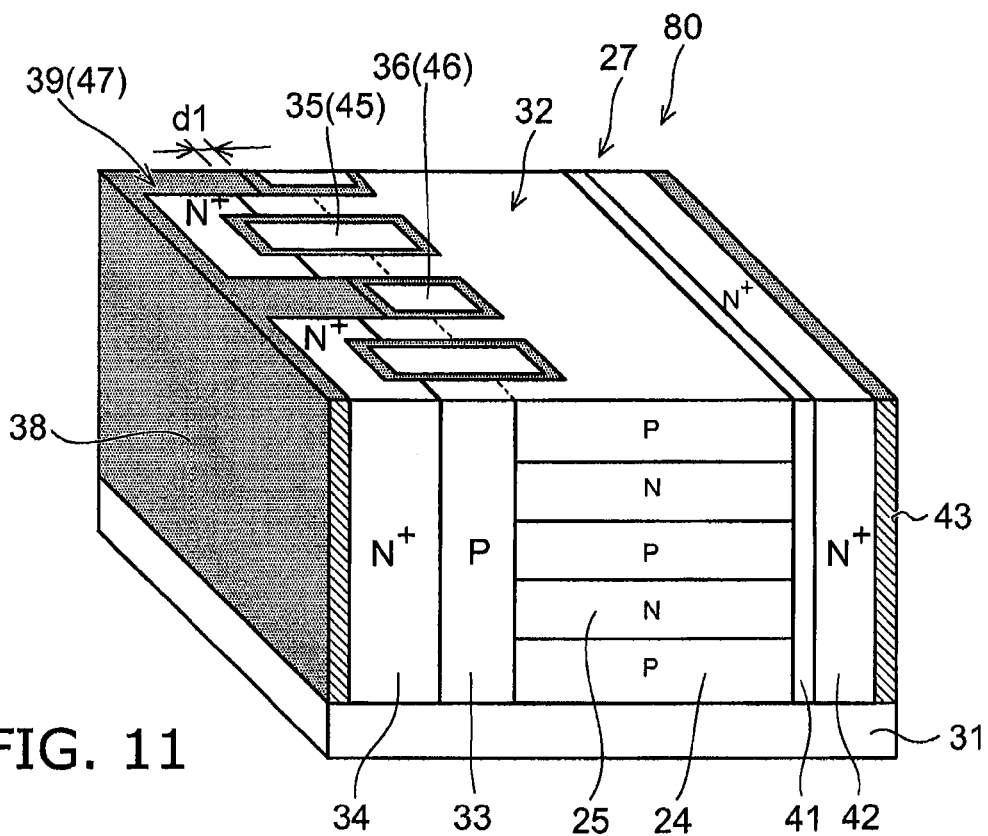

FIG. 11 is a partial sectional view schematically illustrating a structure of a MOSFET 80 according to a variation of the second embodiment. As shown in the figure, the drift region 32 of the MOSFET 80 has a super junction structure in which a P-type pillar and an N-type pillar are alternately laminated upward from the insulating layer 31.

The MOSFET 80 according to this variation is provided with a laminated body 27 in which an N-type semiconductor layer 24, which is an N-type first semiconductor layer, and a P-type semiconductor layer 25, which is a P-type second semiconductor layer, are alternately provided on the main surface of the insulating layer 31 (or a semi-insulating layer). Hence, the drift region 32 is provided with the super junction structure. On one side face of the laminated body 27, the source electrode 38, which is a first main electrode, is provided while being electrically connected, and on the other side face, the drain electrode 43, which is a second main electrode, is provided while being electrically connected.

Moreover, the laminated body 27 includes the base region 33, which is a P-type first semiconductor region, provided communicating with the main surface of the insulating layer 31 from the surface of the laminated body 27 between the source electrode 38 and the drain electrode 43. Moreover, the source region 34, which is an N-type second semiconductor region sandwiched between the source electrode 38 and the base region 33 and the drift region 32 between the base region 33 and the drain electrode 43 are provided.

In the laminated body 27, the trench 45 is formed from the surface across the source region 34, the base region 33, and the drift region 32 toward the main surface of the insulating layer 31. Moreover, in the trench 45, the gate electrode 35, which is a first gate electrode, is provided. The trench 46 is also provided from the surface across a part of the base region 33 and the drift region 32 toward the main surface of the insulating layer 31, and the gate electrode 36, which is a second gate electrode, is provided in the trench 46.

Between the two gate electrodes 35, the trench 47 is formed from the surface across the source region 34 and a part of the base region 33 toward the main surface of the insulating layer 31, and the source electrode 38 is extended in the trench 47. The extended portion 39 is provided so as to adjoin the base region 33 exposed to the inner wall surface of the trench 47 between the source region 34 and the gate electrode 36.

As a result, since the hole injected into the base region 33 from the drift region 32 is discharged to the source electrode 38, the threshold voltage $V_{TH}$ is made stable. Also, the capability for the avalanche breakdown and short-circuit current can be improved.

On the other hand, between the drift region 32 and the drain electrode 43, the N-type semiconductor region 41 and the drain region 42 are provided communicating with the insulating layer 31 from the surface of the laminated body 27. The drain region 42 is an $N^+$-type region doped with an N-type impurity at high concentration. In this variation, the drain region 42 may also be provided as a $P^+$-type region so as to operate as an IGBT or an IEGT.

The laminated body 27 can be formed by providing a plurality of semiconductor layers on the insulating layer 31 through the multi epitaxial growth steps and selective ion implantation of P-type and N-type impurities into the predetermined areas between each epitaxial growth step.

Figure 12:
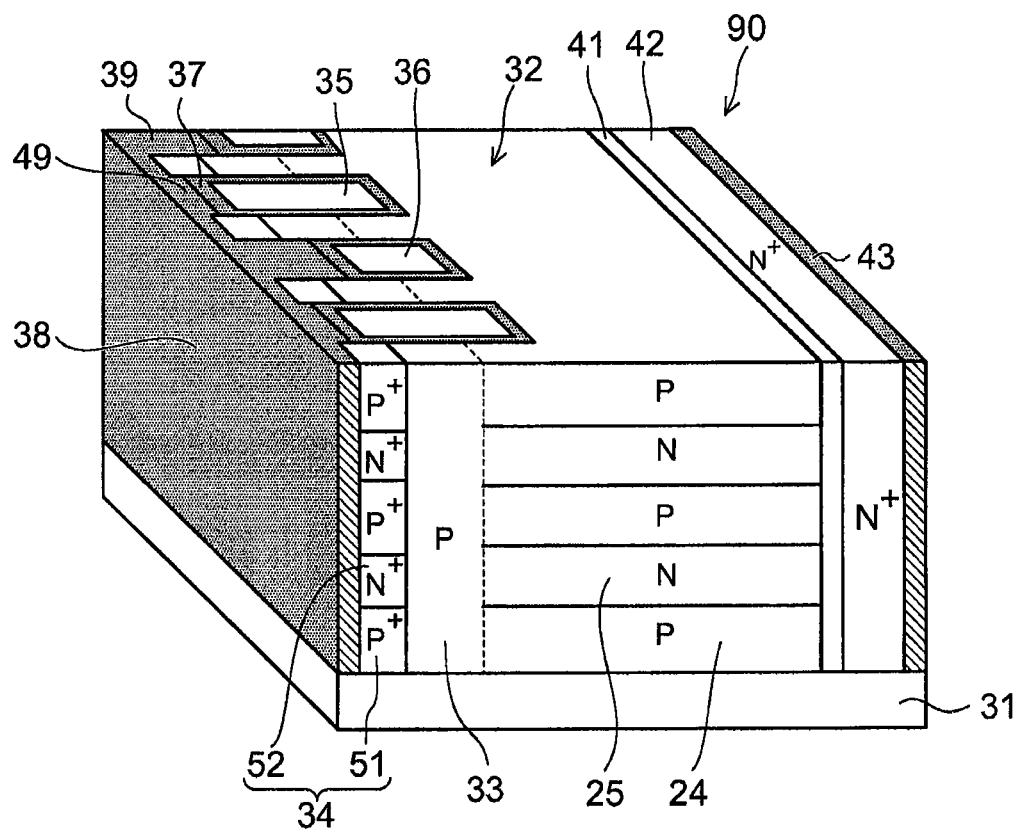

FIG. 12 is a partial sectional view schematically illustrating a structure of a MOSFET 90 according to a variation of the second embodiment. The MOSFET 90 has a configuration in which the source region 34 of the MOSFET 80 shown in FIG. 11 is replaced by a laminated structure of a $P^+$-type contact region 51 and an $N^+$-type source region 52. As a result, the hole of the base region 33 can be discharged to the source electrode 38 via the $P^+$-type contact region 51. The $P^+$-type contact region 51 and the $N^+$-type source region 52 can be both formed by ion implantation.

Furthermore, the thicknesses of the $P^+$-type contact region 51 and the $N^+$-type source region 52 in the lamination direction can be changed by a dose of the impurity ion-implanted therein. For example, by making the dose of the $P^+$-type impurity in the $P^+$-type contact region 51 larger than the dose of the $N^+$-type impurity in the $N^+$-type source region 52, as shown in FIG. 12, the $p^+$-type contact region 51 can be formed thicker than the $N^+$-type source region 52. As a result, the discharge resistance of the hole from the base region 33 to the source electrode 38 can be made small. On the contrary, by increasing the dose of the $N^+$-type impurity, the $N^+$-type source region 52 can be made thicker than the $P^+$-type contact region 51, whereby the ON resistance can be reduced.

Also, in the MOSFET 90, although an extended portion 49 of the source electrode 38 is provided adjacently to the gate electrode 35 via the gate insulating film 37, the $P^+$-type contact region 51 and the $N^+$-type source region 52 can be interposed between the gate electrode 35 and the source electrode 38 without providing the extended portion 49 as in the MOSFET 70 shown in FIG. 10.

Third Embodiment

Figure 13A:
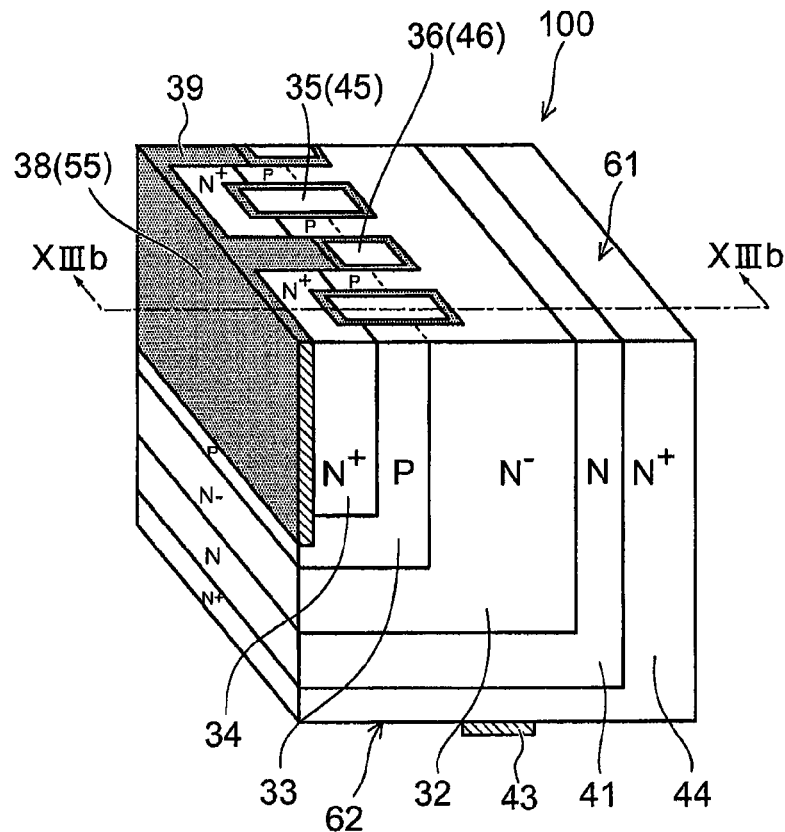
FIGS. 13A and 13B are partial cross-sectional views schematically illustrating a structure of a semiconductor device according to a third embodiment.
Figure 13B:
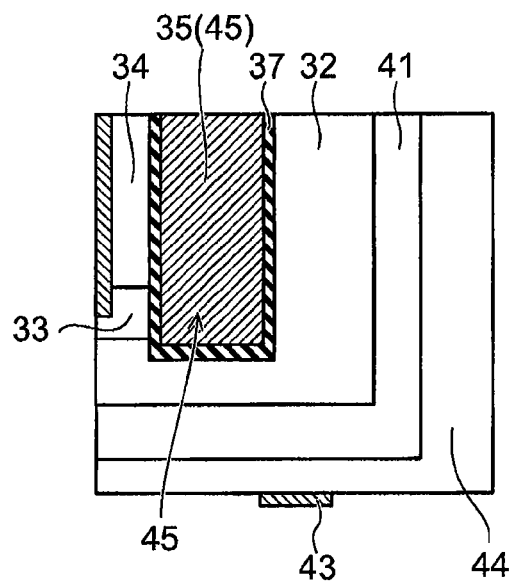

FIGS. 13A and 13B are partial sectional views schematically illustrating a structure of a MOSFET 100 according to a third embodiment.

The MOSFET 100 is provided with the N-type drift region 32 provided on a first main surface 61 of a drain layer 44, which is a semiconductor layer doped with an N-type impurity at high concentration, the base region 33, which is a P-type first semiconductor region provided in the drift region 32, and the source region 34, which is an N-type second semiconductor region provided in the base region 33.

Here, as the drain layer 44, an N-type semiconductor layer formed on a silicon substrate can be used, for example, or a silicon substrate doped with an N-type impurity at high concentration may be used. Also, by using a P-type semiconductor layer instead of the drain layer 44, an IGBT or an IEGT can be obtained.

The semiconductor regions shown in FIGS. 13A and 13B can be formed by sequential epitaxial growth of semiconductor layers, i.e. a semiconductor layer to become the N-type semiconductor region 41, a semiconductor layer to become the drift region 32, a semiconductor layer to become the base region 33, and a semiconductor layer to become the source region 34, on the first main surface 61 of the drain layer 44 in which a predetermined recess portion is provided. Moreover, the first main surface 61, which includes each semiconductor layer in the flattened surface, can be formed by polishing the semiconductor layers grown on the drain layer 44 using CMP (Chemical Mechanical Polish) method, for example.

A plurality of the trenches 45 are formed along the boundary between the drift region 32 and the base region 33 toward a second main surface 62 of the drain layer 44. Then, the gate electrode 35, which is a first gate electrode, is provided in the trench 45. On the other hand, between the two gate electrodes 35, the trench 46 is provided along the boundary between the drift region 32 and the base region 33 toward the second main surface 62 of the drain layer 44. Moreover, the gate electrode 36, which is a second gate electrode, is provided in the trench 46.

The source electrode 38, which is a main electrode, is provided in contact with the source region 34. The source electrode 38 may be provided in a trench 55 communicating with the base region 33 from the surface of the source region 34 along the array of the gate electrodes 35, for example. Moreover, between the two gate electrodes 35, an extended portion of the trench 55 is provided along the boundary between the source region 34 and a base region 33 from the surface across the source region 34 and a part of the base region 33. The source electrode 38 is provided in the trench 55 with the extended portion 39 extending toward the gate electrode 36. The extended portion 39 is provided in contact with the base region 33 exposed in the inner wall surface of an extended portion of the trench 55 between the source region 34 and the gate electrode 36.

FIG. 13B is a schematic diagram illustrating a structure of a XIIIb-XIIIb cross-section shown in FIG. 13A. The trench 45 penetrates the base region 33 and the source region 34 along the boundary between the drift region 32 and the base region 33 from the surface and is formed so as to reach the lower drift region 32. Also, the gate insulating film 37 is formed in the inner surface of the trench 45, and conductive polysilicon, for example, to become the gate electrode 35 is embedded in the trench 45.

In the MOSFET 100 according to this embodiment, since the extended portion 39 of the source electrode 38 is also in contact with the base region 33 exposed to the inner surface of the extended portion of the trench 55 between the gate electrode 36 and the source region 34, the hole injected into the base region 33 from the drift region 32 can be discharged to the source electrode 38 via the exposed portion of the base region 33.

Figure 14A:
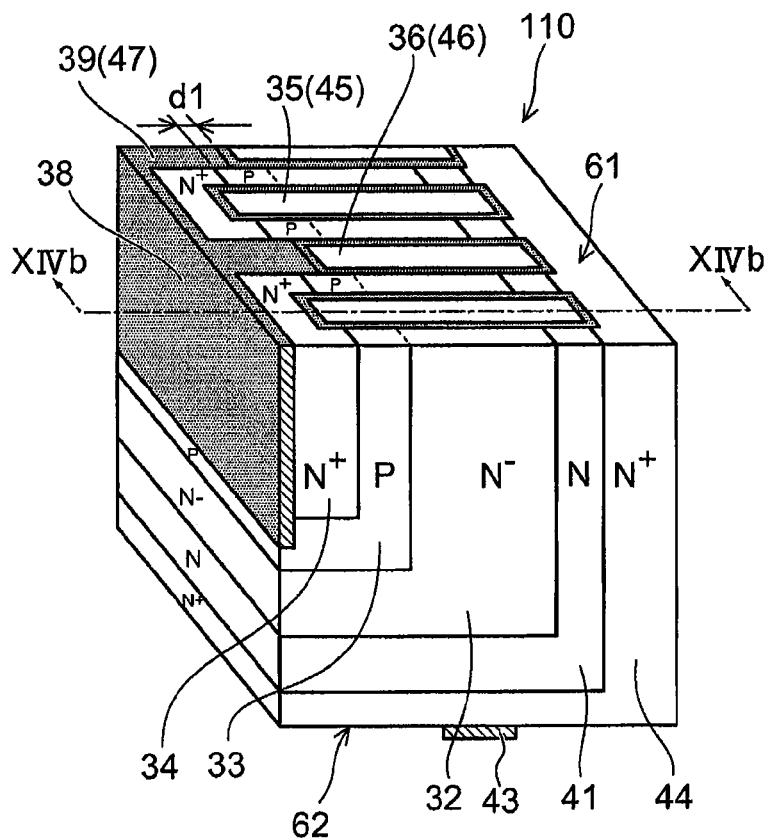
FIGS. 14A and 14B are partial cross-sectional views schematically illustrating a structure of a semiconductor device according to a variation of the third embodiment
Figure 14B:
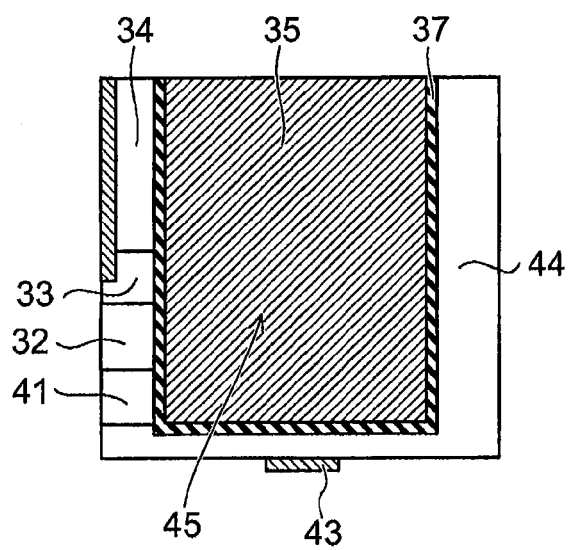

FIG. 14A is a partial sectional view schematically illustrating a structure of a MOSFET 110 according to a variation of the third embodiment. Also, FIG. 14B is a schematic diagram illustrating a structure of a XIVb-XIVb cross-section shown in FIG. 14A.

The MOSFET 110 is different from the MOSFET 100 shown in FIGS. 13A and 13B in a point that the trench 45 and the trench 46 are provided so as to reach the drain layer 44, and the gate electrode 35 and the gate electrode 36 are embedded therein.

That is, as shown in FIG. 14A, the trench 45 is provided from the surface on the first main surface 61 side of the drain layer 44 across the source region 34, the base region 33, the drift region 32, the N-type semiconductor region 41, and the drain layer 44 in the direction of the second main surface 62. Also, as shown in FIG. 14B, the trench 45 is provided so as to penetrate the source region 34, the base region 33, the drift region 32, and the N-type semiconductor region 41 and to reach the drain layer 44. Moreover, the gate insulating film 37 is formed on the inner surface of the trench 45, and conductive polysilicon, for example, to become the gate electrode 35 is embedded therein.

On the other hand, the trench 46 in which the gate electrode 36 is provided is also provided from the surface on the first main surface 61 side of the drain layer 44 across the base region 33, the drift region 32, the N-type semiconductor region 41, and the drain layer 44 so as to reach the drain layer 44 on the second main surface 62 side.

In the MOSFET 110, when a positive gate voltage is applied to the gate electrodes 35 and 36, a channel in which electrons are accumulated is formed in the interface between the drift region 32 and the gate insulating film 37. As a result, the resistance of the drift region 32 is lowered, and the ON resistance can be reduced.

Fourth Embodiment

Figure 15:
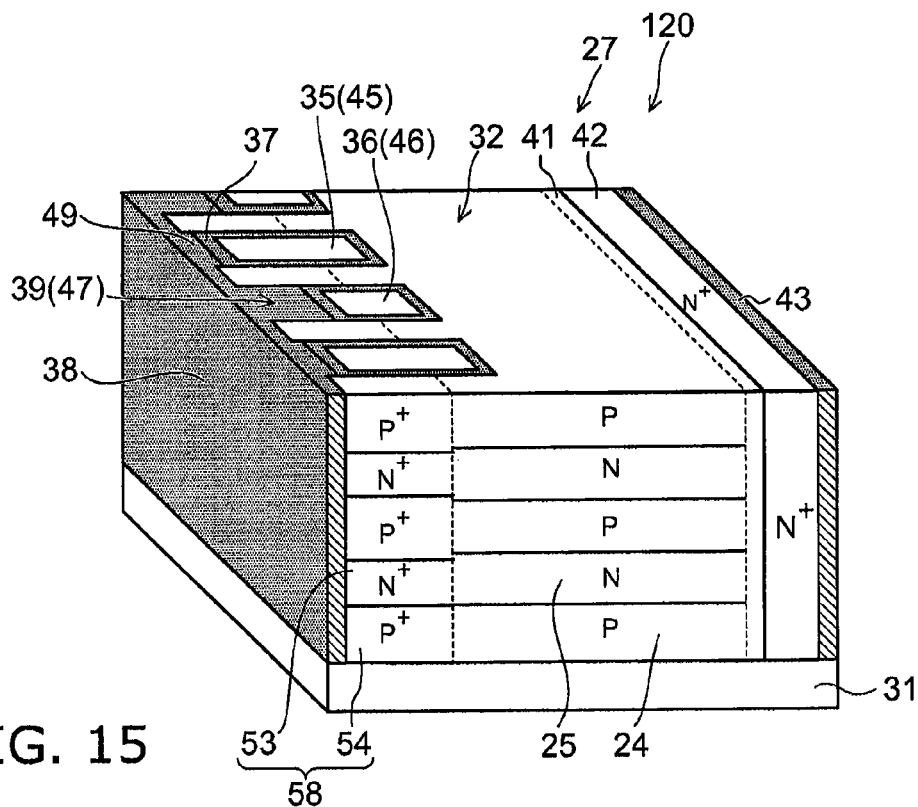
FIG. 15 is a partial cross-sectional view schematically illustrating a structure of a semiconductor device according to a fourth embodiment.

FIG. 15 is a partial sectional view schematically illustrating a structure of a semiconductor device 120 according to a fourth embodiment. The semiconductor device 120 is a power semiconductor device, having a super junction structure composed of a plurality of P-type semiconductor regions 24 and N-type semiconductor regions 25 laminated alternately on the main surface of the insulating layer 31.

The semiconductor device 120 has the laminated body 27 in which the N-type semiconductor region 25 and the P-type semiconductor region 24 are provided alternately on the main surface of the insulating layer 31 (or a semi-insulating layer). On one side face of the laminated body 27, the source electrode 38, which is a first main electrode, is provided while being electrically connected. Also, on the other side face of the laminated body 27, the drain electrode 43, which is a second main electrode, is provided while being electrically connected.

Moreover, between the source electrode 38 and the drain electrode 43, the drift region 32 with the super junction structure in which the P-type semiconductor region 24 and the N-type semiconductor region 25 are alternately laminated is provided. Between the drift region 32 and the source electrode 38, a contact region 58 (first semiconductor region) is provided. The contact region 58 includes a $P^+$-type region 54 (ninth semiconductor region) doped with a P-type impurity at higher concentration than in the P-type semiconductor region 24 and an $N^+$-type region 53 (eighth semiconductor region) doped with an N-type impurity at higher concentration than in the N-type semiconductor region 25, which are alternately laminated on the insulating layer 31.

Also, from the surface across the contact region 58 and the drift region 32, the trench 45 is formed along the boundary between the contact region 58 and the drift region 32. The gate electrode 35, which is a first gate electrode, is provided in the trench 45. Moreover, from the surface across a part of the contact region 51 and the drift region 32, the trench 46 is formed along the boundary between the contact region 58 and the drift region 32. The gate electrode 36, which is a second gate electrode, is provided in the trench 46.

The source electrode 38 of the semiconductor device 120 is electrically connected to the P$^+$-type region 54 and the N$^+$-type region 53 of the contact region 58. The extended portion 39, which is a part of the source electrode 38, is provided extending into the trench 47 formed toward the main surface of the insulating layer 31 from the surface of the P$^+$-type region 54 extending from the source electrode 38 to the vicinity of the gate electrode 36 between the two gate electrodes 35. Also, the extended portion 39 is electrically connected to the contact region 58 exposed in the inner wall surface of the trench 47. Also, an extended portion 49 is provided adjacently to the gate electrode 35 via the gate insulating film 37.

On the other hand, between the drift region 32 and the drain electrode 43, the N-type semiconductor region 41 and the drain region 42 are provided communicating with the main surface of the insulating layer 31 from the surface. In the semiconductor device 120 according to this embodiment, the drain region 42 is an N$^+$-type region doped with an N-type impurity at high concentration, but it may be replaced by a P$^+$-type region doped with a P-type impurity. In that case, the semiconductor device 120 operates as a bipolar element.

Also, the laminated body 27 may be formed by laminating the N-type semiconductor region 25 and the P-type semiconductor region 24 through the multi epitaxial growth steps on the main surface of the insulating layer 31. Also, the above laminated structure can be obtained by selectively Injecting P-type and N-type impurities using ion implantation between the epitaxial growth steps of each semiconductor region.

Subsequently, an operation of the semiconductor device 120 will be described. In the semiconductor device 120, in the contact region 58, the width of the N$^+$-type region 53 is provided smaller than that of the P$^+$-type region 54. Moreover, the N$^+$-type region 53 is depleted by built-in potential of PN junction between the P$^+$-type region 54 and the N$^+$-type region 53. As a result, even if a drain voltage that becomes positive on the drain side is applied between the drain electrode 43 and the source electrode 38, the drain current does not flow in a state, where the gate voltage is not applied to the gate electrodes 35 and 36.

Subsequently, if a positive gate voltage is applied to the gate electrodes 35 and 36, electrons are accumulated between the N$^+$-type region 53 and the gate insulating film 37, and a current channel is formed. Then, a current flows between the drain electrode 43 and the source electrode 38, resulting in an ON state.

At this time, if the hole is injected into the N$^+$-type region 53 from the N-type semiconductor layer 25 of the drift region 32, effective concentration of the N$^+$-type region 53 is changed, the channel resistance is increased, and the ON resistance might be raised.

On the other hand, in the semiconductor device 120, since the source electrode 38 is electrically connected to the N$^+$-type region 53 of the contact region 58 exposed to the inner wall surface of the trench 47, the hole having been injected into the N$^+$-type region 53 can be smoothly discharged to the source electrode 38. As a result, fluctuation in the effective carrier concentration in the N$^+$-type region 53 is suppressed, and the semiconductor device 120 can be stably operated. Also, the avalanche breakdown may be suppressed.

The invention has been described referring to the first to fourth embodiments according to the invention, but the invention is not limited to these embodiments. For example, embodiments having the same technical idea as the invention such as design changes, material changes and the like that could be done by those skilled in the art on the basis of the state-of-art at the time of application are also included in the technical scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a drift region including a semiconductor of a first conductivity type;
   a pair of first gate electrodes contacting the drift region via a first gate insulating film and extending in a first direction into the drift region;
   a second gate electrode contacting the drift region via a second gate insulating film and extending in the first direction into the drift region, the second gate electrode positioned between the pair of first gate electrodes in a second direction perpendicular to the first direction;
   a first semiconductor region of a second conductivity type between each of the first gate electrodes and the second gate electrode in the second direction;
   a second semiconductor region of the first conductivity type selectively provided on the first semiconductor region, and adjacent via the first gate insulating film to one of the first gate electrodes in the pair of first gate electrodes; and
   a main electrode having a first portion that is adjacent in the first direction to the pair of first gate electrodes via the first gate insulating film, and a second portion between the pair of first gate electrodes that is adjacent in the first direction to the second gate electrode via the second gate insulating film, and directly adjacent in the second direction to the first semiconductor region and the second semiconductor region.

2. The device according to claim 1, wherein a width, along the first direction, of the second portion of the main electrode that is in contact with the first semiconductor region is 0.05 μm or more.

3. The device according to claim 1, further comprising:
   a sixth semiconductor region of the second conductivity type between the first semiconductor region and the main electrode in the first direction, wherein
   the second semiconductor region and the sixth semiconductor region are alternately provided in contact with the first semiconductor region along a third direction orthogonal to the first and second directions.

4. The device according to claim 1, further comprising:
   a sixth semiconductor region of the second conductivity type between the first semiconductor region and the main electrode in the first direction, wherein
   the second semiconductor region is in contact with the first semiconductor region and extended along the one of the pair of first gate electrodes in the first direction, and the sixth semiconductor region is in contact with the first semiconductor region and extended along one of the pair of the first gate electrodes in the first direction.

5. The device according to claim 1, further comprising:
   a third semiconductor region of the second conductivity type that is selectively provided on the first semiconductor region, wherein the third semiconductor region has a concentration of the second conductivity type impurities that is greater than a concentration of second conductivity type impurities in the first semiconductor region, and the main electrode is directly adjacent the third semiconductor region in the second direction.

6. The device according to claim 1, wherein
the drift region includes a fourth semiconductor region of the first conductivity type and a fifth semiconductor region of the second conductivity type that are alternately provided along a boundary between the drift region and the first semiconductor region.

7. The device according to claim 1, further comprising:
a seventh semiconductor region of the second conductivity type provided adjacently to the drift region, the drift region being between the first semiconductor region and the seventh semiconductor region.

8. The device according to claim 1, further comprising:
an insulating layer in contact with the drift region and the first semiconductor region, wherein
the drift region and the first semiconductor region are provided adjacently on the main surface of the insulating layer.

9. The device according to claim 8, wherein
the drift region includes a fourth semiconductor region of the first conductivity type and a fifth semiconductor region of the second conductivity type alternately provided in a direction parallel with the main surface of the insulating layer along a boundary between the drift region and the first semiconductor region.

10. The device according to claim 8, wherein
the drift region includes a fourth semiconductor region of the first conductivity type and a fifth semiconductor region of the second conductivity type alternately laminated on the insulating layer.

11. The device according to claim 8, further comprising:
a sixth semiconductor region of the second conductivity type between the first semiconductor region and the main electrode, wherein
the second semiconductor region and the sixth semiconductor region are alternately provided on the insulating layer.

12. The device according to claim 8, wherein
the insulating film is one of a semi-insulating layer and a $SiO_2$ film provided on a substrate.

13. The device according to claim 1, wherein
the drift region is on a first main surface of a semiconductor layer of the first conductivity type;
the first semiconductor region is in the drift region;
the second semiconductor region is in the first semiconductor region; and
the main electrode is in contact with the second semiconductor region in a trench communicating with the first semiconductor region from a surface of the second semiconductor region.

14. The device according to claim 13, wherein
the pair of first gate electrodes and the second gate electrode penetrate through the first semiconductor region in the first direction.

15. The device according to claim 13, wherein
the pair of first gate electrode and the second gate electrode penetrate through the first semiconductor region and the drift region in the first direction.

16. The device according to claim 8, wherein
the drift region includes a fourth semiconductor region of the first conductivity type and a fifth semiconductor region of the second conductivity type alternately laminated on the insulating layer; and
the first semiconductor region includes an eighth semiconductor region of the first conductivity type and a ninth semiconductor region of the second conductivity type alternately laminated on the insulating layer.

17. The device according to claim 16, wherein
a width of the eighth semiconductor region in the lamination direction is smaller than the width of the ninth semiconductor region in the lamination direction.

* * * * *